United States Patent [19]

Weidler

[11] Patent Number: 4,995,814

[45] Date of Patent: Feb. 26, 1991

[54] CONNECTOR FOR MATING BLADE-SHAPED MEMBERS

[75] Inventor: Charles H. Weidler, Lancaster, Pa.

[73] Assignee: AMP Incorporated, Harrisburg, Pa.

[21] Appl. No.: 515,400

[22] Filed: Apr. 27, 1990

Related U.S. Application Data

[63] Continuation-in-part of Ser. No. 451,471, Dec. 15, 1989.

[51] Int. Cl.[5] .......... H05K 1/00

[52] U.S. Cl. .......... 439/61; 439/65; 439/513; 439/856

[58] Field of Search .......... 439/851, 856, 630, 631, 439/636, 637, 654, 60, 61, 65, 668, 669, 786, 787, 512, 513

[56] References Cited

U.S. PATENT DOCUMENTS

| | | | |
|---|---|---|---|
| 3,149,893 | 9/1964 | Dupre | 439/60 |
| 3,778,753 | 12/1973 | Occhipinti et al. | 439/631 |
| 4,220,382 | 9/1980 | Ritchie et al. | 439/61 |
| 4,659,155 | 4/1987 | Walkup et al. | 439/108 |
| 4,684,191 | 8/1987 | Feher et al. | 439/246 |
| 4,747,790 | 5/1988 | Masuda et al. | 439/631 |
| 4,845,589 | 7/1989 | Weidler et al. | 361/342 |
| 4,878,862 | 11/1989 | Wise | 439/787 |

*Primary Examiner*—David L. Pirlot

*Attorney, Agent, or Firm*—Katherine A. Nelson

[57] ABSTRACT

An electrical connector 10 for mating two blade-shaped members 120,130 includes a dielectric spacer member 38, a plurality of discrete electrically isolated first terminal members 68 and at least a plurality of discrete electrically isolated second terminal members 88 secured to each opposing major surfaces 40 of spacer member 36 for electrical interconnection of first and second electrical articles; and means insulating associated said first and second terminal members from each other. Each first and second terminal member 68,88 includes first and second cantilevered spring arms 70,76,90,96 respectively extending outwardly in opposite directions from a respective intermediate terminal portion 74,94, the plurality of contact arm of first terminal members 68 defining a first and second contact arm arrays 80,84 and the plurlaity of contact arm 90,96 of second terminal members 88 defining third and fourth contact arm arrays 102,104. In the assembled connector 10 the opposed first and second contact arm arrays 90,96 define first and second blade receiving receptacles 82,86. The opposed third and fourth contact arrays 102,104 extend outwardly and essentially coplanar with the associated first and second contact arm arrays 80,84 thereby extending first and second blade receiving receptacles 82,86 respectively. Upon mating the connector 10 with blade-shaped members 120,130, a plurality of discrete current paths are established between the corresponding first and second sides 122,132;126,136 of the blade-shaped members 120,130 respectively.

9 Claims, 6 Drawing Sheets

CONNECTOR FOR MATING BLADE-SHAPED MEMBERS

RELATED PATENT APPLICATIONS

This application is a Continuation-in-Part of U.S. patent application Ser. No. 451,471 filed Dec. 15, 1989.

FIELD OF THE INVENTION

This invention is related to the field of electrical connectors and more particularly to an electrical connector for interconnecting to blade-shaped members.

BACKGROUND OF THE INVENTION

In forming a power distribution system it is necessary to provide means for a hot line carrying power to the required load and a return line to the power source. A plurality of interconnections are typically required on a power distribution system for an integrated circuit logic system. There are connections between the power supply and bus bar, bus bar and a mother board, mother board and the daughter board, and connections between the daughter board and the socket in which chips are usually mounted and a connection between the socket and an actual integrated circuit. For each point of interconnection in the line going from the hot terminal to the load there is another point of interconnection to complete the return line of the circuit. Furthermore, in many integrated circuit systems there can be no more than 250 millivolts of drop in the voltage at each load. In addition, some logic systems require multiple voltage power distribution systems. These systems, therefore, require electrical connectors or contacts that will minimize voltage drops as the load is placed on the system.

To help increase the operating speed, power distribution systems are often designed to use a laminated busbar wherein the hot and return conductors are placed in close proximity separated by a thin insulative layer. One problem associated with laminated bus bars, however, is the inability to use standard two sided receptacle contacts to interconnect the laminated bus bar with another or to terminate to the laminated bus bar since a standard contact will electrically short the outer most conductive layers of the bus bar. Typically interconnections to laminated bus bars are made by providing the bus bar layers with tabs that extend outwardly from the various layers to which a wire or contact may be bolted to one voltage or layer. Since the wide bus bars are good conductors of heat as well as electricity, it is extremely difficult to achieve effective connections to the bus bar by soldering techniques. It is desirable to have a separate means for connecting to the laminated bus bar system that retains the "pluggability" of the system.

U.S. patent application Ser. No. 07/451,471, the parent of the present application, discloses an electrical connector for mating two blade-shaped members that includes a dielectric spacer member having first and second terminal elements secured to opposing major surfaces thereof, the first terminal element being adjacent the spacer member and the second terminal element disposed outwardly of and insulated from the first terminal element. Each terminal element includes an array of cantilevered spring contact arms extending outwardly from each of two opposed leading and trailing edges of a body section, and respective pairs of arrays define first and second blade-receiving receptacles therebetween, the arrays of the first and second terminal elements being essentially coplanar and forming extended blade receiving receptacles at leading and trailing edges thereof. Upon mating of the connector with blade like members, the arrays of contact arms engage respective sides of the members at a plurality of locations and establish a plurality of current paths therebetween, with the current paths established through the first terminal elements being electrically isolated from the current paths established through the second terminal element. The connector of Ser. No. 07/451,471, therefore, has two isolated sets of current paths.

SUMMARY OF THE INVENTION

Accordingly, to alleviate the disadvantages and deficiencies of the prior art the present invention is directed to a connector and connector assembly that can carry high currents of two different voltages in a plurality of isolated paths across an interface.

The electrical connector includes a dielectric spacer member with opposed major surfaces extending between opposed first and second ends, a plurality of first discrete terminal members and at least a plurality of discrete second terminal members secured to each of the opposing major surfaces of the spacer member for electrical interconnection of first and second electrical articles at leading and trailing edges respectively. The first terminal members are adjacent the spacer member and the second terminal members are disposed outwardly of the first terminal members and are electrically insulated from each other. Each first and second terminal member includes first and second cantilevered spring contact arms extending in opposite directions from an intermediate terminal portion. The array of first and second contact arms of the first terminal members on opposed spacer surfaces extend outwardly from the major surface define first and second blade receiving receptacles respectively therebetween. The corresponding third and fourth arrays of contact arms of the second terminal members extend to free ends outwardly from major spacer surface defining third and fourth arrays of contact arms, which are disposed substantially coplanar with the associated first and second arrays and located axially outwardly therefrom, thereby extending the first and second blade receiving receptacles. Upon mating the connector with first and second blade-shaped members, and outward deflection against spring bias of the contact arms by the blade-shaped members, a plurality of discrete electrical paths are established between respective sides of the first and second blade-shaped members.

It is the object of the present invention to provide a separable connection between a connector and at least one bar-shaped member, such as bus bar, circuit panel or the like, thus maintaining the pluggability of the members into the connector.

It is another object of the invention to provide a plurality of isolated parallel current paths between two blade shaped members.

More particularly it is an object of the invention to provide a separable connection between two laminated bus bars.

It is an additional object of the invention to provide a means whereby the resistance and the normal force required for effective interconnection across an interface can be lowered.

It is another object of the invention to provide a means for connecting members to and disconnecting members from a multivoltage power system.

The invention itself, together with further objects and its attendant advantages, will be best understood by reference to the following detailed description taken in conjunction with the accompanying drawing.

DETAILED DESCRIPTION OF THE PREFERRED EMBODIMENT

Figure 1:
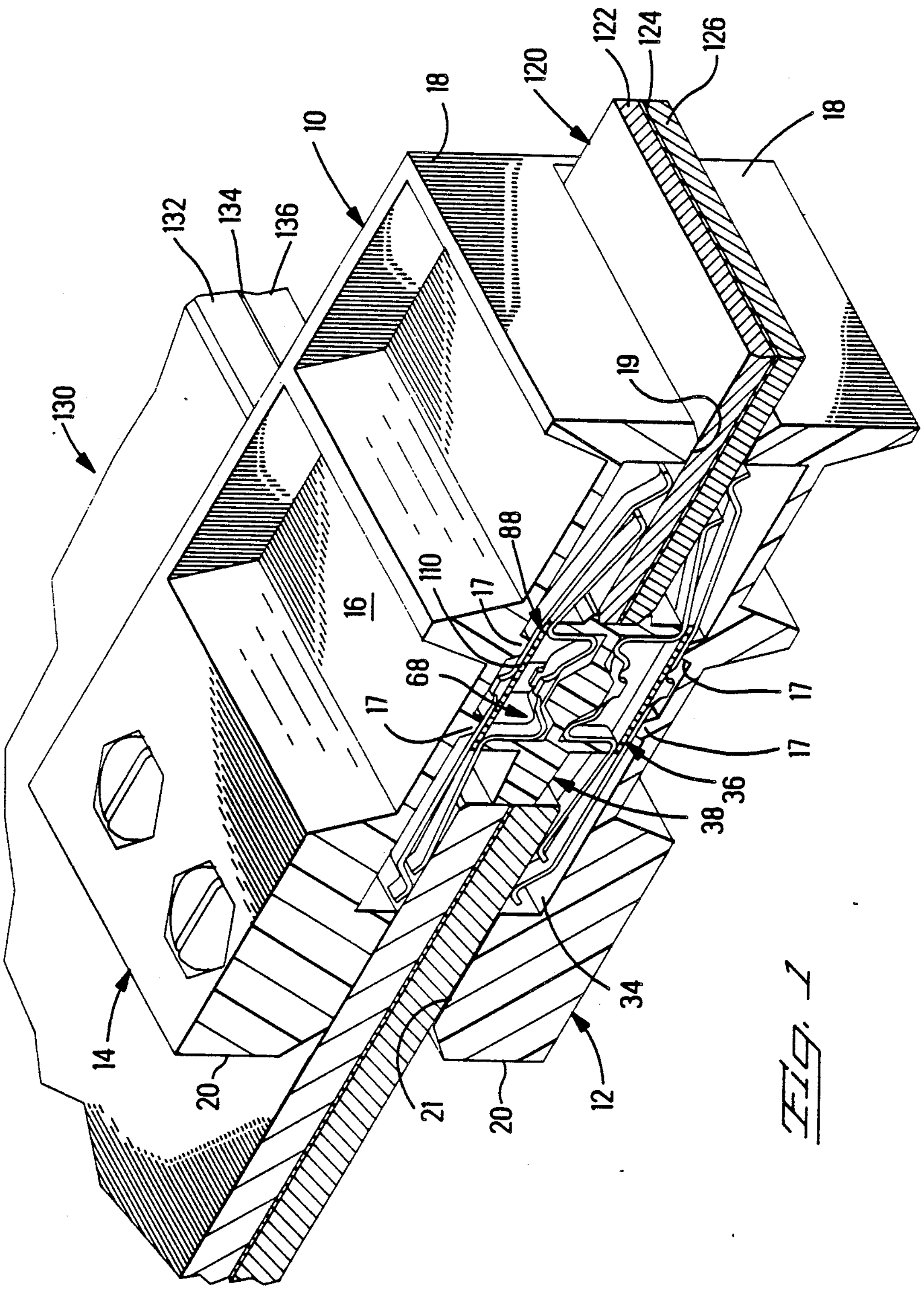
FIG. 1 is a perspective sectional view of the connector of the present invention interconnecting two blade-shaped members.
Figure 2:
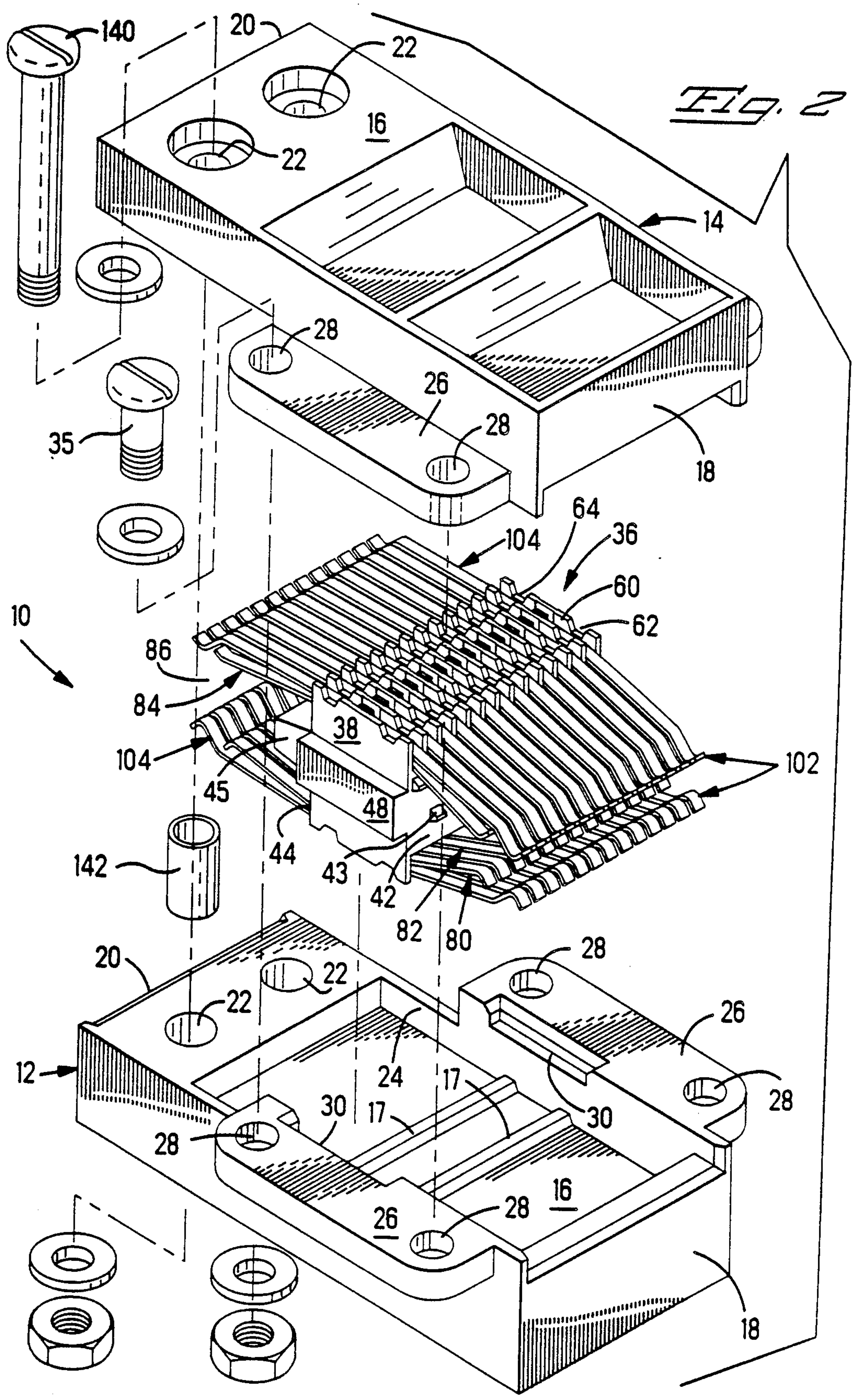
FIG. 2 is a partially exploded view of the connector assembly with the housing exploded from the terminal and spacer members.
Figure 3:
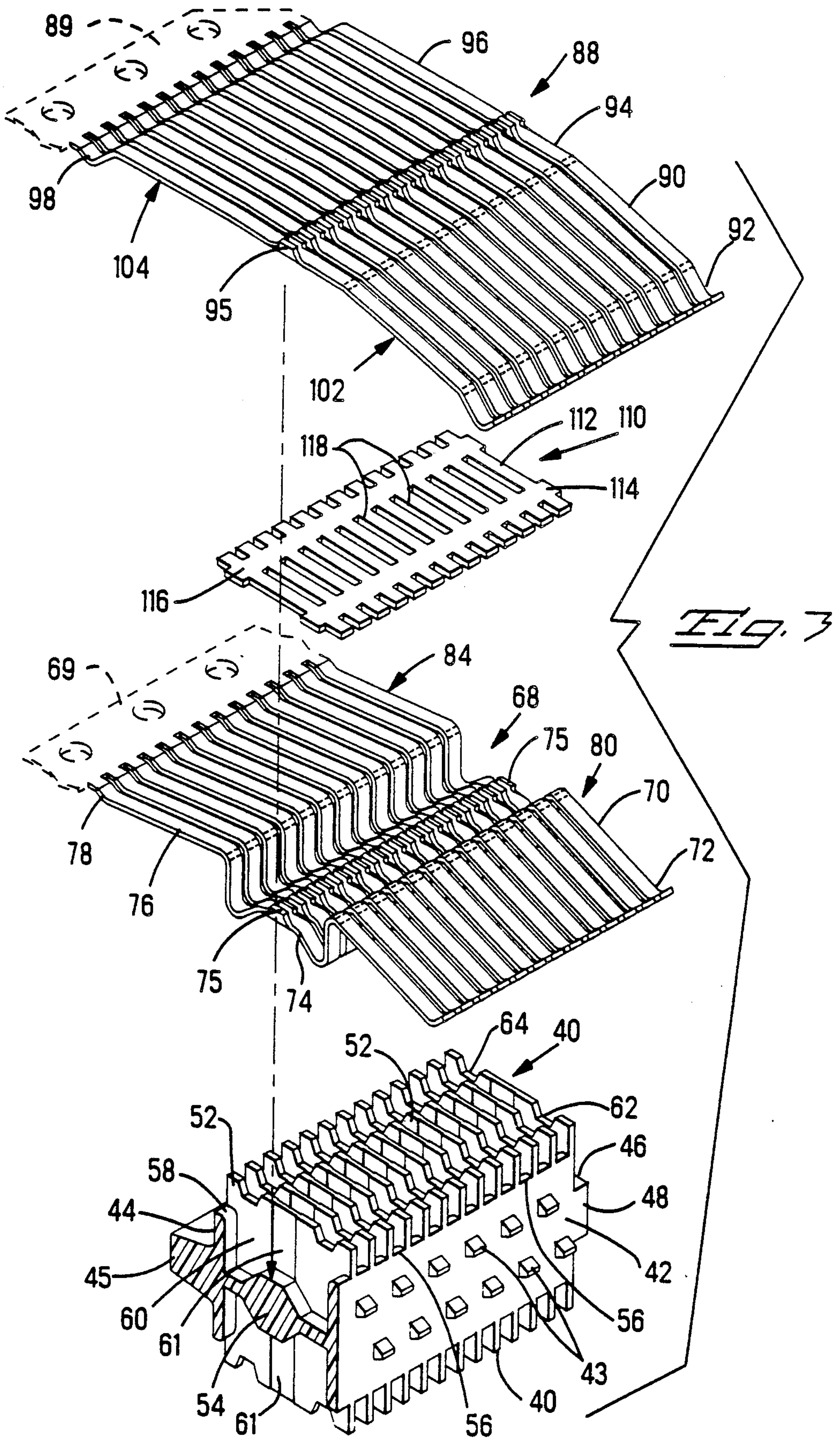
FIGS. 3 and 3A are exploded views of the terminal members and spacer member illustrating the structure thereof.
Figure 3A:
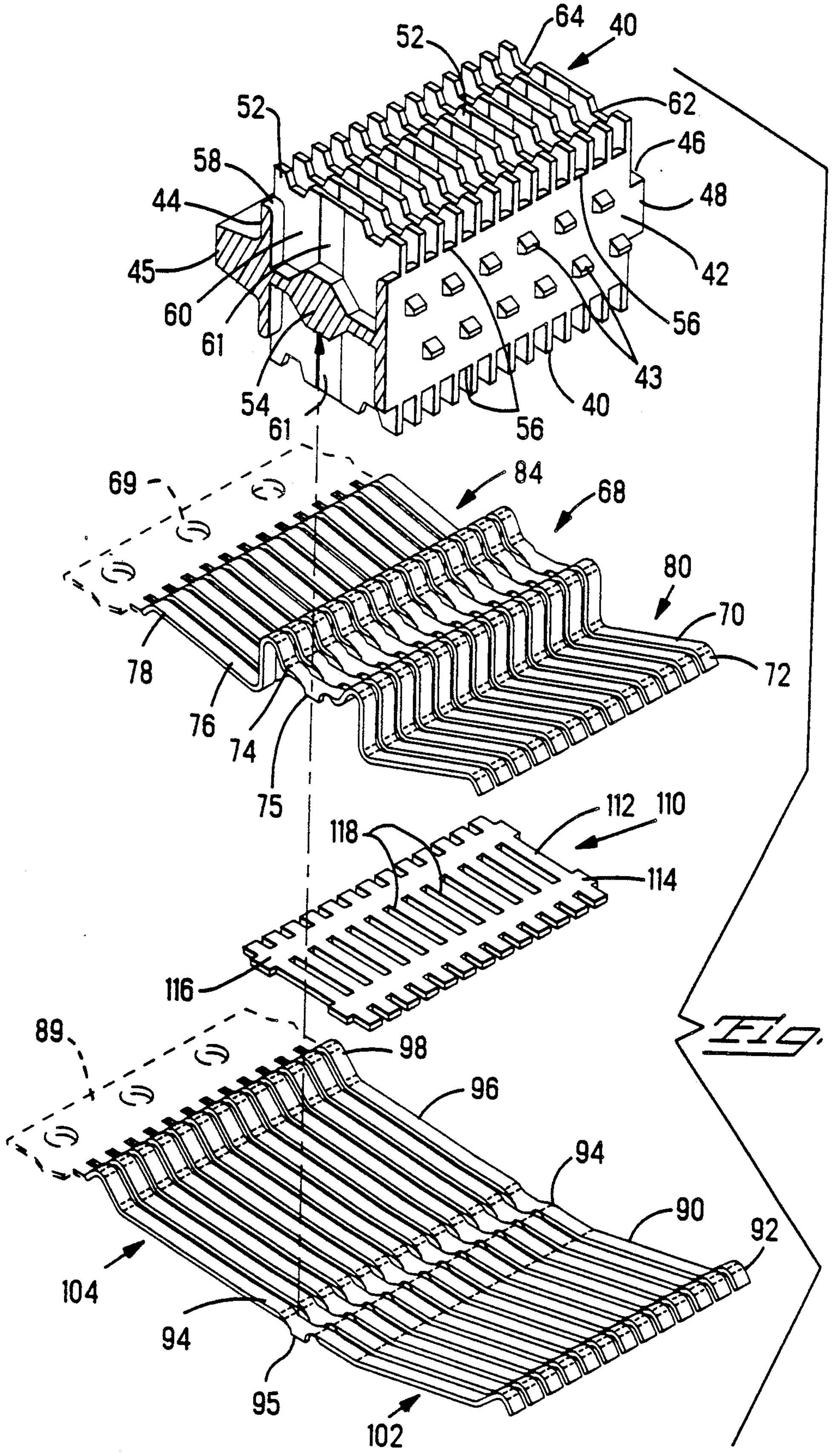
Figure 4:
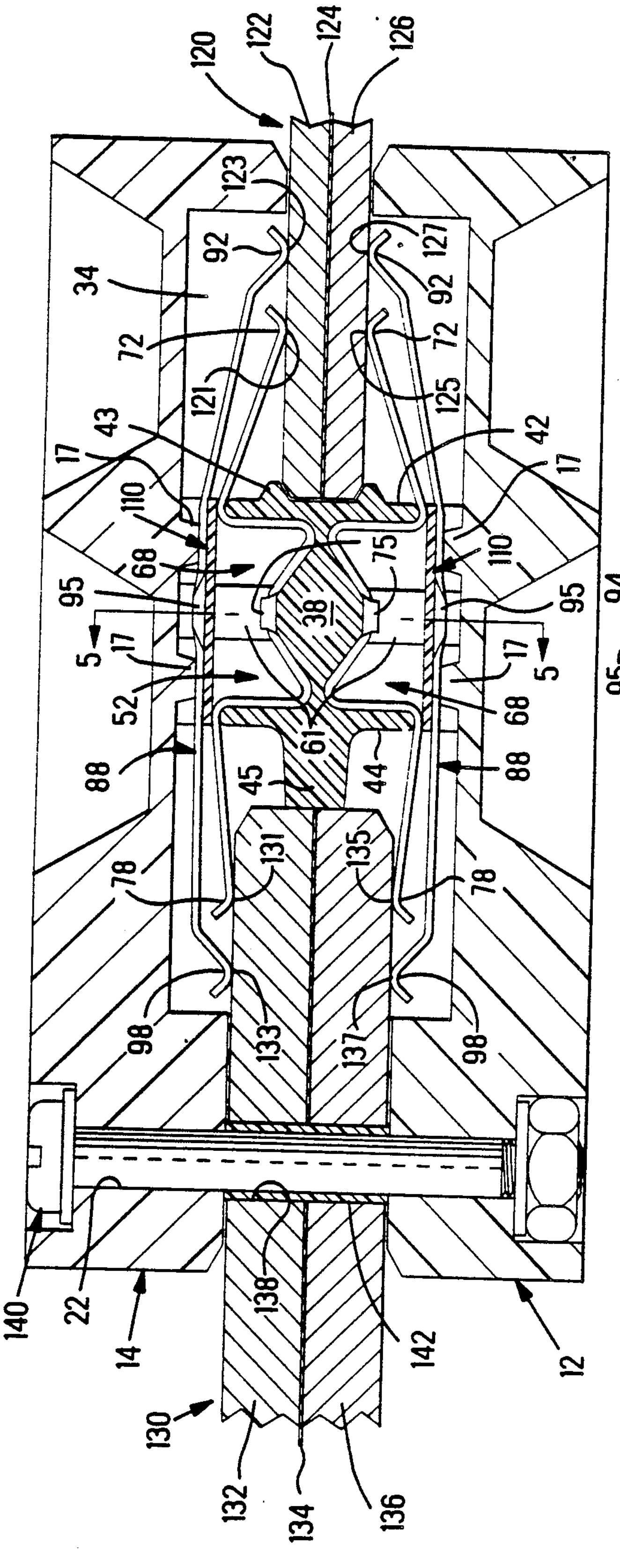
FIG. 4 is an enlarged longitudinal section view of the connector of FIG. 1.

Referring now to FIGS. 1, 2, 3, 3A and 4, electrical connector 10 of the present invention is comprised of first and second housing members 12,14 and electrical connector subassembly 36. In the preferred embodiment first and second housing members 12,14 are hermaphroditic members. The same numbers, therefore, will be used to identify the corresponding portions of the first and second housing members 12,14. As best seen in FIG. 2, each housing member 12, is comprised of a base 16, forward and trailing edges 18,20 and opposed sides 24. When housing members 12,14 are assembled, corresponding bases 16, leading and trailing ends, 18,20 and side walls 24 define a connector subassembly and receiving cavity 34 therebetween as seen in FIG. 4. Base 16 further includes inwardly directed ribs or bars 17 which extend transversely between opposed side walls 24. In the assembled connector 10, ribs 17 lie against connector assembly 36 as seen in FIGS. 1 and 4 and hold the terminal members therewithin. Housing member 12 further includes flanges 26 extending outwardly along portions of side walls 24. Flanges 26 include apertures 28 for receiving fastening means 35 for joining connector housings together and further include a recess 30 that cooperates with complementary protrusions in the connector subassembly 36 to position the subassembly 36 within the housing members 12,14.

Connector subassembly 36 comprises a dielectric spacer member 38 having opposed major surfaces 40, and at least a plurality of first terminal members 68 secured to each of the opposing major surfaces 40 for electrical interconnection of first and second electrical articles 120,130 at leading and trailing edges 42,44 respectively thereof as best seen in FIG. 4. Dielectric spacer member 38 also includes opposed sides 46, which in the preferred embodiment, include outwardly extending portions 48 that cooperate with corresponding recesses 30 in the housing members 12,14 to locate subassembly 36 therewithin as shown in FIGS. 3 and 3A. For purposes of illustration, outwardly extending projection 48 has been eliminated from FIG. 2. Leading edge 42 of dielectric member 38 further includes protrusions 43 for positioning the first blade member 120 therebetween and trailing edge 44 includes a projection 45 which acts as a stop surface for the second blade member 130.

Dielectric spacer member 38 includes a plurality of terminal receiving cavities 52 extending between leading and trailing edges 42,44 and into member 38 from opposed major surfaces 40. Terminal receiving cavities 52 are separated from each other by walls 60, which extend between leading and trailing edges 42,44. Each cavity 52 includes lower surface 54 and leading and trailing openings 56,58 respectively. Major surfaces 40 of spacer 38 further include first and second slots 62,64 extending between spacer side walls 48 and through cavity sidewalls 60, the slots 62,64 defining support surfaces for insulation means 110 as more fully described below.

Each first terminal member 68 includes first and second discrete cantilevered spring contact arms 70,76 extending outwardly in opposite directions from intermediate terminal body portion 74, the arms extending to respective free ends 72,78 outwardly from the plane of the respective intermediate body portion 74. Intermediate portion 74 of each terminal member 68 includes a "U" shaped portion 25, which extends slightly outwardly and cooperates with slots 61 of spacer walls 60, to position respective terminal members 68 in spacer member 38 and restrain axial movement thereof, as seen in FIG. 4. In the preferred embodiment intermediate body portion 74 is configured to be received within a corresponding terminal receiving cavity 52 of dielectric means 38 such that intermediate portion 74 is proximate lower surface 54. When assembled in the connector 10, the free ends 72,78 of the respective first terminal members 68 define first and second arrays 80,84 of spring contact arms extending outwardly from leading and trailing edges 42,44 of dielectric body member 38, the corresponding first arrays 80 forming a first blade receiving receptacle 82 and corresponding second arrays 84 forming a second blade receiving receptacle 86 therebetween as best seen in FIG. 2.

In the preferred embodiment connector 10 further includes a plurality of discrete second terminal members 88, each second terminal member 88 comprising first and second cantilevered spring contact arms 90,96 extending in opposite directions from a intermediate body portion 94, the contact arms 90,96 extending to respective free ends 92,98 outwardly from the plane of the respective intermediate portion 94. The intermediate portions 94 of respective terminal members 88 are configured in a "U" shape 95 in the same manner as previously described. The "U" shaped portion 95 also cooperates with slot 61 of spacer wall 60 to restrain axial movement of terminal members 88. In the assembled connector 10, terminal members 68,88 are held within their respective slot positions by bars or ribs 17 of respective housing members as shown in FIGS. 1 and 4. In the assembled connector 10 the plurality of discrete second terminal elements 88 are received in upper portions of the cavities 52 of dielectric spacer 38 and are electrically isolated from the first terminal members 68 by means of an insulating layer 110 having a plurality of spaced apart strap-like portions 112 extending between first and second cross bar portions 114,116 with slot-like apertures 118 extending therethrough for receiving corresponding portions of walls 60 along major surfaces 40 of spacer member 38. The cross bar portions 114,!16 lie along corresponding slots 62,64 of insulating layer extends along the major surface 40 to provide electrical isolation between the corresponding terminal members 68,88 and support for terminal members 88. As is shown in FIGS. 3 and 3A the outermost portion of major surface 40 is configured to receive the insulating means 110. As is also shown in FIGS. 3 and 3A, the intermediate portion 94 of second terminal members 88 are formed only to a slight extent in comparison to first terminal members 68, such that second terminal members 88 extend through the upper portion of cavity 52 with the respective corresponding intermediate portions 74,94 of first and second terminal members 68,88 being significantly spaced from each other.

As is best seen in FIG. 2, the plurality of second terminal members 88 form third and fourth arrays 102,104 of contact arms with the respective free ends 92,98 extending outwardly toward the corresponding array 102,104 of second terminal members disposed on the opposed side 40 of spacer member 38, the third arrays 102, being proximate and associated with the first arrays 80 and the fourth arrays 104 being proximate and associated with the second arrays 84. The configuration of the first and second terminal members 68,88 respectively are such that in the assembled connector 10 the free ends 92 of the third contact arm array 102 are disposed substantially coplanar with the free ends 72 of the first contact arm array 80 and are located axially outwardly therefrom to extend the first blade receiving receptacle 82. Similarly the free ends 98 of the fourth contact arm array 104 are disposed substantially coplanar with the free ends 78 of the second contact arm arrays 84 and are located axially outwardly therefrom, thereby extending the second blade receiving receptacle 86 as best seen in FIG. 4.

Figure 5:
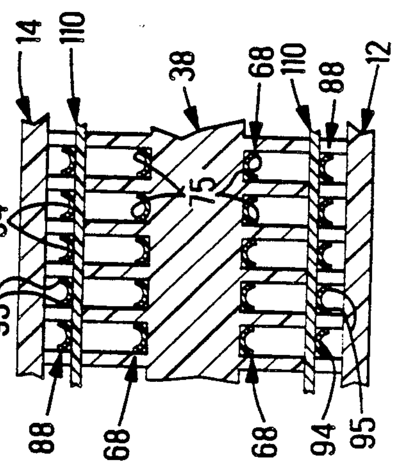
FIG. 5 is a cross sectional view taken along line 5—5 of FIG. 4.

As is shown in FIG. 1 and 4 leading and trailing edges of the blade receiving apertures 19,21 of the assembled connector 10 are chamfered to provide lead-ins for blade members 120,130 respectively. Subassembly 36 is held in cavity 34 of housing such that the contact arms of the respective first and third arrays 80,102 extend toward the leading edges 18 and corresponding contact arms of the second and fourth arrays 84,104 extend toward the trailing edges 20 respectively. FIG. 5 shows a cross section of the assembled connector 10 of FIG. 4 indicating the location of the first and second terminal members 68,88 isolated by the insulation means 110.

FIGS. 1 and 4 show first and second blade members 120,130 received in leading and trailing apertures 19,21 of connector assembly 10. First blade member is shown as a laminated bar member having a first side 122, second side 126 which are insulated from each other by insulating means 124. The second blade member 130 comprises first side 132 and second side 136, which are insulated from each other by insulating means 134. In the embodiment shown, connector 10 is mounted to blade member 130 by fastening means 140. As is shown in FIG. 4, blade member 130 includes an aperture 138 extending therethrough for receiving fastening means 140. To maintain electrical isolation between the two sets of terminals and first and second sides of the blade member, an insulating sleeve member 142 is disposed around the fastening means 140. These insulating sleeves 140 are shown in FIGS. 2 and 4.

Upon mating connector 10 with first and second blade like members 120,130 and outward deflection against the spring bias of all of the contact arms by the blade members, the free ends 72,92 of the first and third arrays 80,102 engage the first blade member 120 at a plurality of inner and outer locations 121,123 respectively on the first side 122 and a plurality of inner and outer locations 125,127 respectively along the second side 126 thereof. Similarly the free ends 78,98 of the second and fourth arrays 84,104 respectively engage the second blade member 130 at a plurality of inner and outer locations 131,133 on the first side 132 thereof and a plurality of inner and outer locations 135,137 respectively along the second side 136 thereof as shown in FIG. 4. As best seen in FIGS. 4 and 5, each array of discrete terminal members 68,88 interconnects and provides a plurality of isolated current paths between corresponding first sides 122,132 or corresponding second sides 126,136 of blade member 120,130.

In the preferred embodiment connector 10 is assembled by inserting corresponding flanges 48 of connector subassembly 36 into corresponding apertures 30 in side walls of housing members 14,16 to locate the subassembly 36 within the housing cavity 34. The connector housing halves are secured together by fastening means 35 inserted through apertures 28 in the outwardly extending flanges 26 of side walls 24.

Figure 6:
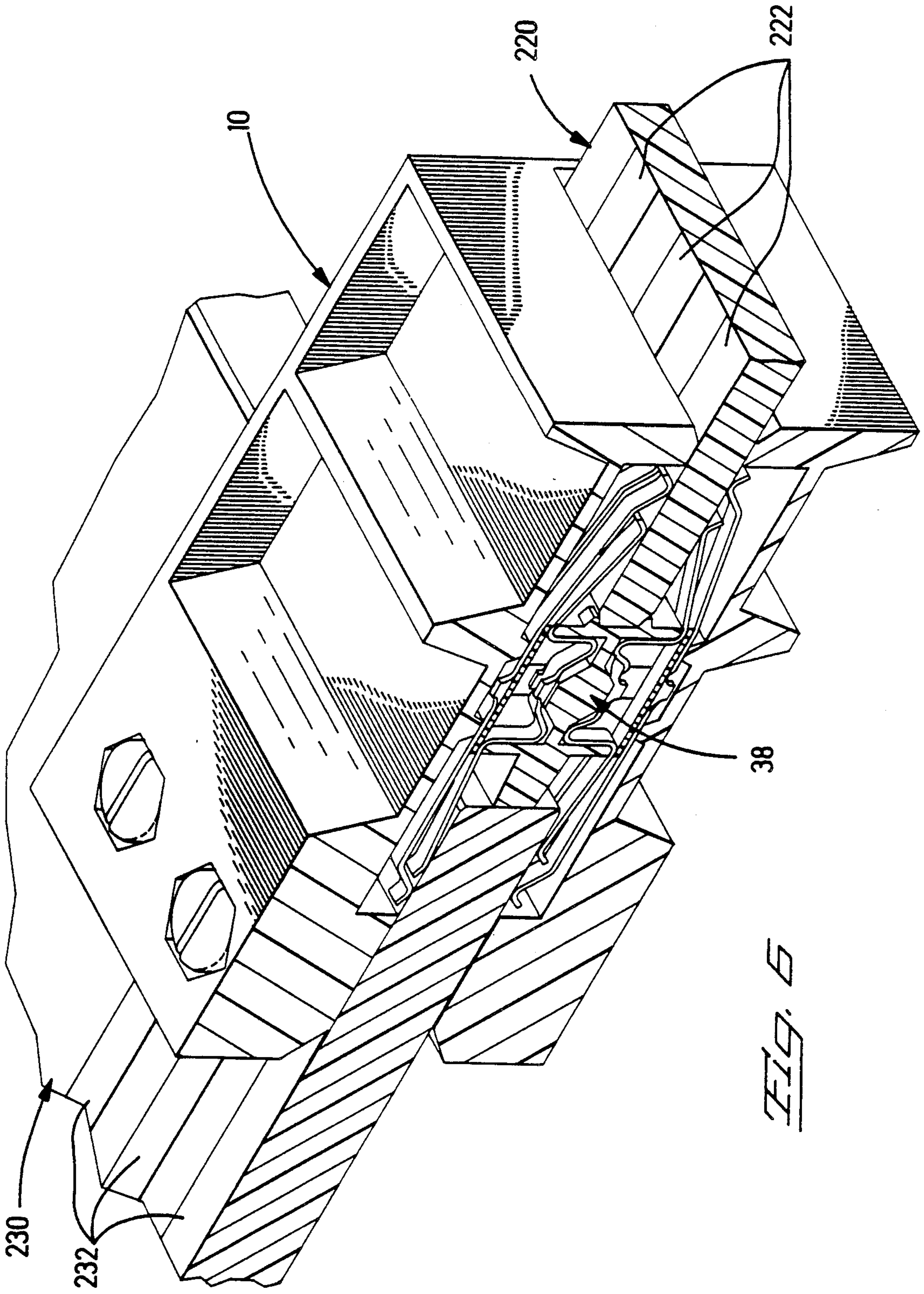
FIG. 6 is a perspective sectional view showing the connector interconnecting a plurality of isolated paths between two circuit boards.

FIG. 6 shows connector 10 interconnecting a plurality of isolated conductive paths 222,232 respectively on blade shaped members 220,230. Since the plurality of corresponding first and second terminal members 68,88 are isolated from each other, a plurality of isolated electrical connector paths can be interconnected using the same connector assembly.

The terminal members are preferably stamped and formed members made from a conductive material having the desired mechanical properties, and in particular low stress relaxation. Suitable materials include copper alloys, such as Olin C-151 available from Olin Brass, East Alton, Ill. C-151 has 85% to 95% of the conductivity of pure copper yet retains very good mechanical properties such as tensile strength and low relaxation under stress. The number of terminal members used in the connector depends upon the width of the discrete terminal members and the bar shaped members to be interconnected thereby. The resistance at the interface is lowered and the normal force required per contact arm is lowered by using a plurality of contact arms. In the preferred method of making terminal members, a plurality of terminal members are stamped and formed in a continuous manner such that at least one end remains attached to respective carrier strip 69,89, (shown in phantom in FIGS. 3 and 3A) with the terminal members 68,88 being formed at the desired spacing. The terminal members 68,88 are disposed into the housing cavities and the respective carrier strips 69,89 are severed therefrom. A selected length of strip having the desired number of formed terminal members is severed from the strip, and loaded into the spacer member cavities at the desired locations. In the presently preferred embodiment terminal members 68,88 are stamped from the same width stock material terminal members 68,88 thereby having the same electrical path length. The intermediate portion 74 of respective terminal members 68 are formed to shorten the axial length between the contact arms 70,76 as compared to the axial length of contact arms 90,96 of terminal members 88, thereby providing inner and outer contact arrays.

A suitable insulting material for insulation means 110 includes material such as MYLAR available from E. I. DuPont de Nemours and Company and other materials as known in the art. The layer needs to be of suitable thickness to provide support for the outer terminals as well as provide insulation. For the presently preferred embodiment, the layer is about 0.032 inches (0.08 centimeters thick). In the preferred embodiment dielectric spacing member 38 is molded from a glass filled polyetherimide available from G. E. Plastics, Pittsfield, Mass. under the trade name ULTEM 2300. Other materials known in the art to be stable at high temperatures and non-hydroscopic are also suitable. Housing members 12,14 can be made from a similar material.

As can be seen from the Figures, the present invention provides an electrical connector having an assembly of discrete terminal elements that can carry high currents of two different voltages in a plurality of isolated current paths. across an interface. The present invention further allows the replacement of two single voltage bus bars by a dual voltage laminated bus bar. While the connector is shown mated to dual voltage bus bar members, it is to be understood that the blade-shaped members may be portions of circuit boards having conductors on opposed sides thereof as well as blade-shaped members having a single voltage. The present invention also is suitable for use with circuit boards and the like.

It is thought that the electrical connector of the present invention and many of its attendant advantages will be understood from the foregoing description. Changes may be made in the form, construction and arrangement of parts thereof without departing from the spirit and scope of the invention or sacrificing all of its material advantages.

I claim:

1. An electrical connector for mating two blade shaped members, each having opposed first and second sides, said connector comprising:

a dielectric spacer member having opposed major surfaces extending between opposed first and second ends;

a plurality of discrete electrically isolated first terminal members and a least a plurality of discrete electrically isolated second terminal members secured to each of said opposing major surfaces of said spacer member for electrical interconnection of first and second electrical articles at leading and trailing edges respectively, said plurality of first terminal members being adjacent said spacer member and said plurality of second terminal members disposed outwardly of said first terminal members; and means insulating associated said first and second terminal members from each other;

each said first terminal member including first and second cantilevered spring contact arms extending outwardly in opposite directions from an intermediate body portion, the plurality of first terminal members defining first and second arrays of contact arms extending from respective said opposed ends of said spacer member, the contact arms of each said first and second arrays of first terminal members extending to free ends outwardly from a plane of respective said intermediate portion toward a corresponding first and second contact arm array of first terminal members along a respective said major surface of said spacer member defining first and second blade receiving receptacles axially outwardly of said first and second spacer member ends;

each second terminal member including first and second cantilevered spring contact arms extending outwardly in opposite directions from an intermediate portion thereof, the plurality of second terminal members defining third and fourth arrays of contact arms extending from respective said opposed ends of said spacer member, said contact arms of both said third and fourth arrays extending to respective free ends outwardly from the plane of a respective said intermediate portion toward a corresponding contact arm array of said second terminal members along said end proximate said major surface of said spacer member, said fourth arrays being proximate and associated with said second arrays;

said spring contact arms of said third and fourth arrays being longer than the corresponding spring contact arms of said first and second arrays such that the free ends of the contact arms of said third arrays are disposed substantially coplanar with those of the associated first arrays and located axially outwardly therefrom thereby extending said first blade-receiving receptacle, and the free ends of the contact arms of said fourth arrays are disposed substantially coplanar with those of the associated second arrays and located axially outwardly therefrom thereby extending said second blade-receiving receptacle; whereby upon mating said connector with first and second blade-shaped members and outward deflection against spring bias of all said contact arms by said blade-shaped members, said first and third spring contact arm free ends engage said first blade-shaped member at a plurality of inner and outer locations along each said first and second sides thereof and said second and fourth spring contact arm free ends engage said second blade-shaped member at a plurality of inner and outer locations along each said first and second sides thereof, and each said first terminal member interconnects one of said first and second sides of said first blade-shaped member with a corresponding one of said first and second sides of said second blade-shaped member establishing a plurality of discrete current paths therealong, and each said second terminal member also interconnected one of said first and second sides of said first blade-shaped member with a corresponding one of said first and second sides of said second blade-shaped member along a plurality of inner and out locations along each said first and second sides thereof, establishing a plurality of isolated current paths therealong, all thereby lowering resistance.

2. The connector of claim 1 further including housing means, said housing means including means for retaining said terminal members in said spacer member.

3. The connector of claim 1 wherein said first terminal members are isolated from said second terminal members associated therewith, a dielectric plate-like member extending between opposed first and second ends of said dielectric spacer member, said plate-like member being disposed adjacent said major surfaces of said spacer member.

4. The connector of claim 1 wherein said dielectric spacer member includes a plurality of cavities extending between said first and second ends of said spacer member, each cavity being adapted to receive said intermediate portion of a respective one of said first terminal members.

5. The connector of claim 1 wherein said first terminal members provide the same electrical path length as said second terminal members.

6. The connector of claim 1 mounted to a first blade-shaped member and electrically interconnecting said first blade-shaped member to a second blade-shaped member.

7. The connector of claim 6 wherein at least one of said first and second blade-shaped members is a bipolar bus bar.

8. The connector of claim 6 wherein at least one of said first and second blade-shaped members is a circuit board.

9. The connector of claim 6 wherein said first and second blade-shaped members are circuit boards and said connector interconnects a plurality of corresponding isolated current paths between said circuit boards.

* * * * *

UNITED STATES PATENT OFFICE
CERTIFICATE OF CORRECTION

Patent No. 4,995,814 Dated February 26, 1991

Inventor(s) Charles H. Weidler

It is certified that error appears in the above-identified patent and that said Letters Patent is hereby corrected as shown below:

In the Claims

Claim 1, Column 8, Line 42 - The word "interconnected" should be --interconnects--.

Signed and Sealed this

Eighteenth Day of August, 1992

Attest:

DOUGLAS B. COMER

*Attesting Officer*

*Acting Commissioner of Patents and Trademarks*